(12) United States Patent
Zhao

(10) Patent No.: US 11,025,087 B2
(45) Date of Patent: Jun. 1, 2021

(54) CONTROL CIRCUIT COMPATIBLE WITH BATTERY POWER SUPPLY AND EXTERNAL POWER SUPPLY

(71) Applicant: ZTE CORPORATION, Guangdong (CN)

(72) Inventor: Zhanke Zhao, Guangdong (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 16/476,869

(22) PCT Filed: Oct. 28, 2017

(86) PCT No.: PCT/CN2017/108161
§ 371 (c)(1),
(2) Date: Jul. 10, 2019

(87) PCT Pub. No.: WO2018/133484
PCT Pub. Date: Jul. 26, 2018

(65) Prior Publication Data
US 2019/0356160 A1     Nov. 21, 2019

(30) Foreign Application Priority Data
Jan. 20, 2017   (CN) .......................... 201710045045.4

(51) Int. Cl.
*H02J 9/06* (2006.01)
*G06F 1/26* (2006.01)
*H01L 29/808* (2006.01)

(52) U.S. Cl.
CPC .............. *H02J 9/061* (2013.01); *G06F 1/263* (2013.01); *H01L 29/808* (2013.01); *H02J 9/068* (2020.01)

(58) Field of Classification Search
CPC . H02J 9/061; H02J 9/06; H02J 7/0068; G06F 1/263; G06F 1/30; G06F 1/305; H01L 29/808
See application file for complete search history.

(56) References Cited

U.S. PATENT DOCUMENTS

2017/0222424 A1* 8/2017 Fukuo ...................... H02H 3/33
2017/0310152 A1* 10/2017 Toyoda ..................... H02J 9/06

* cited by examiner

Primary Examiner — Patrick C Chen

(57) ABSTRACT

A control circuit compatible with battery power supply and external power supply. A first end of a switch module is connected to a power connector module, a second end thereof is connected to a second end of a switch control module, and a third end thereof is connected to an external power supply connector module; the switch module is used for disconnecting a power supply circuit between the battery connector module and the power supply output end when receiving a first control signal, and for connecting the power supply circuit when receiving a second control signal; the switch control module is used for outputting the first or second control signal based on whether an external power supply signal is received; the battery connector module is adapted to be connected to a battery; and the external power supply connector module is adapted to be connected to an external power supply.

5 Claims, 4 Drawing Sheets

CONTROL CIRCUIT COMPATIBLE WITH BATTERY POWER SUPPLY AND EXTERNAL POWER SUPPLY

FIELD OF THE INVENTION

The present disclosure relates to the field of terminal technologies, and in particular, to a control circuit compatible with a battery power supply and an external power supply.

BACKGROUND OF THE INVENTION

Nowadays, mobile intelligent terminals have been widely used and have gained in popularity. For fashionable appearance, these mobile intelligent terminals are made increasingly thinner in their structures by the design manufacturers, and most of them adopt a built-in battery (i.e., a non-detachable battery). Compared with a detachable battery, the built-in battery having a same capacity takes up less space, making a mobile phone lighter and more beautiful while maintaining its performance.

However, the built-in battery usually uses a lithium-ion battery, and its life span decreases as the number of times of charging increases. Each charging cycle may shorten to some extent the life span of the lithium-ion battery. The built-in battery thus has a short life span because the mobile phone has no other power supply. When the built-in battery of the wireless terminal is too aged to be used, the user has to replace the entire mobile phone or return the mobile phone to the manufacturer for replacement of the back cover (including the built-in battery), which increases the cost of using the mobile phone by the user.

SUMMARY OF THE INVENTION

The technical problem to be solved by the present disclosure is to provide a control circuit compatible with a battery power supply and an external power supply, which can supply power to an electronic device from the external power supply without taking out the battery, thereby prolonging the life span of the battery.

Embodiments of the present disclosure provide a control circuit compatible with a battery power supply and an external power supply, including:

a switch module, a switch control module, a battery connector module, and an external power supply connector module, a first end of the switch module being connected to the battery connector module, a second end of the switch module being connected to a second end of the switch control module, and a third end of the switch module, which serves as a power supply output end, being connected to the external power supply connector module, wherein the switch module is configured to disconnect a power supply circuit between the battery connector module and the power supply output end when receiving a first control signal output from the switch control module, and to connect the power supply circuit between the battery connector module and the power supply output end when receiving a second control signal output from the switch control module;

the switch control module is configured to output the first control signal when receiving an external power supply signal output from the external power supply connector module, and to output the second control signal when failing to receive an external power supply signal output from the external power supply connector module;

the battery connector module is configured to output a battery power supply signal to the switch module when being connected to a battery; and the external power supply connector module is configured to output the external power supply signal to the switch module and the switch control module when being connected to the external power supply.

According to an exemplary embodiment, the battery connector module includes two ends, and the external power supply connector module includes three ends, wherein a first end of the battery connector module is a battery positive electrode connecting end and is connected to the first end of the switch module, and a second end of the battery connector module is a battery negative electrode connecting end and is connected to ground;

a first end of the external power supply connector module is an external power supply positive electrode connecting end and is connected to the third end of the switch module; a second end of the external power supply connector module is an external power supply positive electrode connecting end and is connected to a first end of the switch control module; and a third end of the external power supply connector module is an external power supply negative electrode connecting end and is connected to ground.

According to an exemplary embodiment, the switch module includes: a P-channel metal oxide semiconductor field effect transistor P1, wherein a drain of the P-channel metal oxide semiconductor field effect transistor P1 serves as the first end of the switch module; a gate of the P-channel metal oxide semiconductor field effect transistor P1 serves as the second end of the switch module; and a source of the P-channel metal oxide semiconductor field effect transistor P1 serves as the third end of the switch module;

the switch control module includes: a first resistor R1, a second resistor R2 and a first capacitor C1, wherein, a first end of the first resistor R1 serves as a first end of the switch control module; a second end of the first resistor R1 serves as the second end of the switch control module and is connected to a first end of the second resistor R2 and a first end of the first capacitor C1; and a second end of the second resistor R2 and a second end of the first capacitor C1 are connected to ground, wherein a resistance value r1 of the first resistor R1 and a resistance value r2 of the second resistor R2 satisfy the following conditions:

$$\frac{r_2}{r_1} \geq \frac{V_{SS2}}{U_{TH}} - 1,$$

wherein, $V_{SS2}$ is a voltage of the external power supply, and $U_{TH}$ is a lower limit of an absolute value of a gate-source voltage between the gate and the source which turns on the P-channel metal oxide semiconductor field effect transistor P1.

According to an exemplary embodiment, the switch module includes: an N-channel metal oxide semiconductor field effect transistor N1, wherein a source of the N-channel metal oxide semiconductor field effect transistor N1 serves as the first end of the switch module; a gate of the N-channel metal oxide semiconductor field effect transistor N1 serves as the second end of the switch module; and a drain of the N-channel metal oxide semiconductor field effect transistor N1 serves as the third end of the switch module;

the switch control module includes: a boost module U1, wherein a first end of the boost module serves as a first end of the switch control module; a second end of the boost module servers as the second end of the switch control module; and a third end of the boost module serves as a third end of the switch control module;

the boost module is configured to prohibit the boost module from performing boosting processing when a voltage of the third end of the boost module is at a high level, and to enable the boost module to perform boosting processing when the voltage of the third end of the boost module is at a low level, wherein the boosting processing is to perform boosting processing on an input voltage of the first end of the boost module to obtain a boosting signal and to output the boosting signal from the second end of the boost module;

the second end of the boost module is connected to ground via a connection with a first resistor R1, and the third end of the boost module is connected to ground via a connection with a second resistor R2, wherein, the boosting processing of the boost module satisfies the following conditions:

$$|V_H - V_{SS1}| \geq U_{TH},$$

wherein, $V_H$ is a voltage of the boosting signal; $V_{SS1}$ is a voltage of the battery power supply; and $U_{TH}$ is a lower limit of an absolute value of a gate-source voltage between the gate and the source which turns on the N-channel metal oxide semiconductor field effect transistor N1.

According to an exemplary embodiment, the boost module includes a boost chip, a power supply end of the boost chip being connected to the battery connector module.

Compared with the prior art, in the circuit compatible with a battery power supply and an external power supply provided by the embodiments of the present disclosure, a switch module and a switch control module are added between the battery power supply and the external power supply. The switch control module outputs different control signals to the switch module by detecting whether the external power supply is connected, and the switch module disconnects the battery power supply circuit when receiving the control signal corresponding to the detection of the external power supply and enables the external power supply. Embodiments of the present disclosure are capable of supply power to an electronic device from the external power supply without taking out the battery, thereby prolonging the life span of the battery.

DETAILED DESCRIPTION OF THE EMBODIMENTS

The embodiments of the present disclosure will be described in detail below with reference to the accompanying drawings in order to make the objectives, technical solutions, and advantages of the present disclosure more clear. It should be noted that, in the case of no conflict, the embodiments of the present application and the features in the embodiments may be arbitrarily combined with each other.

Embodiment One

Figure 1:
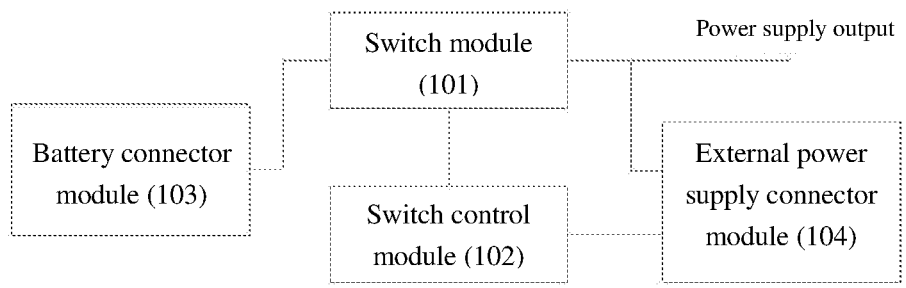
FIG. 1 is a schematic diagram of a control circuit compatible with a battery power supply and an external power supply according to Embodiment One of the present disclosure.

As shown in FIG. 1, the present embodiment provides a control circuit compatible with a battery power supply and an external power supply. The control circuit includes: a switch module 101, a switch control module 102, a battery connector module 103, and an external power supply connector module 104. A first end of the switch module 101 is connected with the battery connector module 103; a second end of the switch module 101 is connected with a second end of the switch control module 102; and a third end of the switch module 101, which serves as a power supply output end, is connected with the external power supply connector module 104.

The switch module 101 is configured to disconnect a power supply circuit between the battery connector module 103 and the power supply output end when receiving a first control signal output from the switch control module 102, and to connect a power supply circuit between the battery connector module 103 and the power supply output end when receiving a second control signal output from the switch control module 102.

The switch control module 102 is configured to output the first control signal when receiving an external power supply signal output from the external power supply connector module 104, and to output the second control signal when the external power supply signal output from the external power supply connector module 104 is not received.

The battery connector module 103 is configured to output a battery power supply signal to the switch module 101 when being connected to the battery.

The external power supply connector module 104 is configured to output an external power supply signal to the switch module 101 and the switch control module 102 when being connected to the external power supply.

The control circuit further includes the following features.

Figure 2:
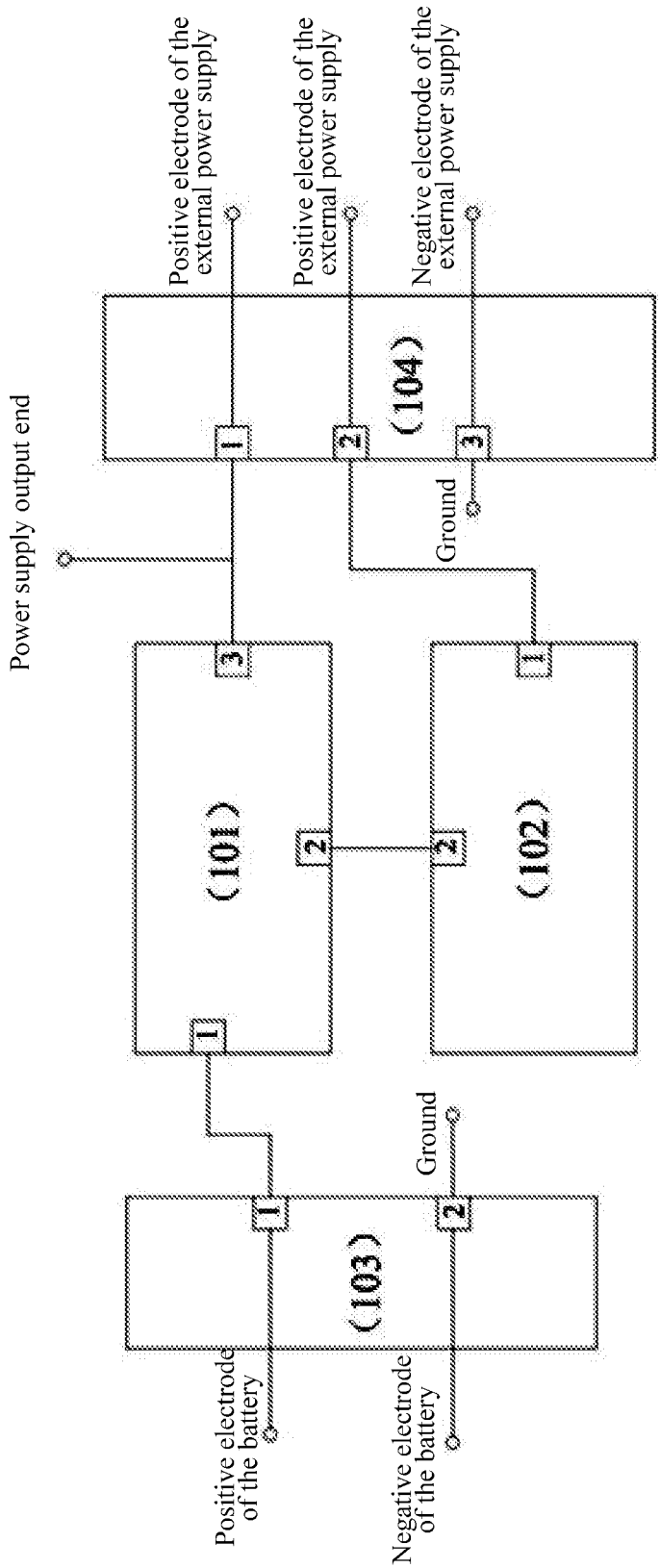
FIG. 2 is a schematic diagram of the control circuit compatible with a battery power supply and an external power supply according to Embodiment One of the present disclosure, in which the control circuit has an external power supply socket module and a battery connector module.

As shown in FIG. 2, in one implementation mode, the battery connector module includes two ends, and the external power supply connector module includes three ends.

A first end of the battery connector module is a battery positive electrode connecting end and is connected with the first end of the switch module, and a second end of the battery connector module is a battery negative electrode connecting end and is connected to ground.

A first end of the external power supply connector module is an external power supply positive electrode connecting end and is connected with the third end of the switch module; a second end of the external power supply connector module is an external power supply positive electrode connecting end and is connected with a first end of the switch control module; and a third end of the external power supply connector module is an external power supply negative electrode connecting end and is connected to ground.

Figure 3:
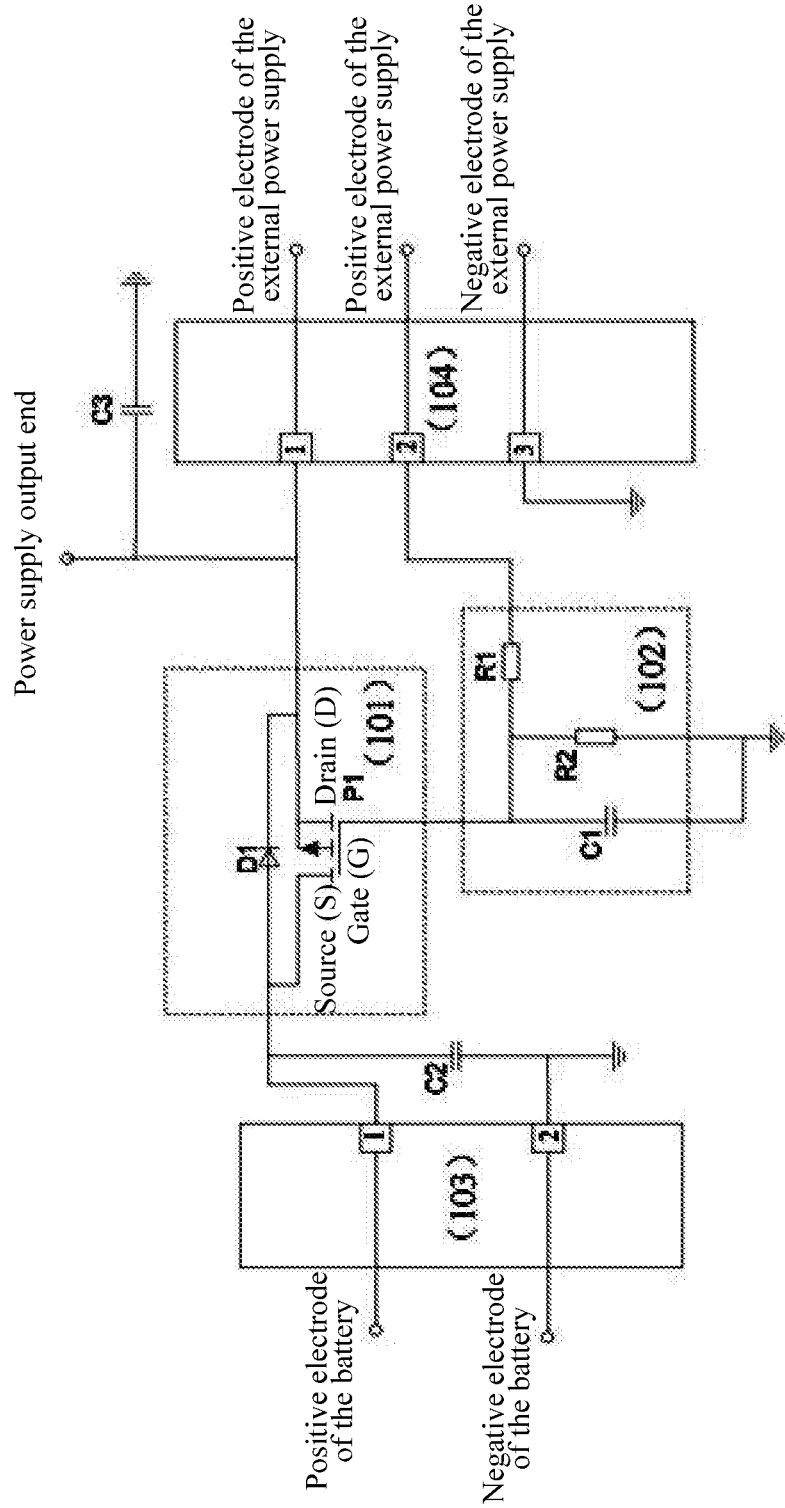
FIG. 3 is a schematic diagram of the control circuit compatible with a battery power supply and an external power supply according to Embodiment One of the present disclosure, in which a switch module includes a P-channel MOSFET.

As shown in FIG. 3, in one implementation mode, the switch module includes: a P-channel MOSFET (Metal Oxide Semiconductor Field Effect Transistor) P1. A drain of the P-channel MOSFET P1 serves as the first end of the switch module; a gate of the P-channel MOSFET P1 serves as the second end of the switch module; and a source of the P-channel MOSFET P1 serves as the third end of the switch module.

The switch control module includes: a first resistor R1, a second resistor R2, and a first capacitor C1. A first end of the first resistor R1 serves as the first end of the switch control module; a second end of the first resistor R1 serves as the second end of the switch control module and is connected with a first end of the second resistor R2 and a first end of the first capacitor C1; and a second end of the second resistor R2 and a second end of the first capacitor C1 are connected with ground.

In the present embodiment, the P-channel MOSFET P1 is turned on when a turn-on condition is satisfied and turned off when the turn-on condition is not satisfied. When the P-channel MOSFET P1 is turned on, a circuit between the drain and the source is connected, and when the P-channel MOSFET P1 is turned off, the circuit between the drain and the source is disconnected.

In the present embodiment, a source voltage of the P-channel MOSFET (which may be simply referred to as PMOS transistor) P1 is $U_S$, a gate voltage thereof is $U_G$, and a drain voltage thereof is $U_D$. A voltage of the battery power supply is $V_{SS1}$, and A voltage of the external power supply is $V_{SS2}$. A gate-source voltage $U_{GS}$ between the gate and the source of the PMOS transistor P1 is $U_{GS}=U_G-U_S$. $U_{TH}$ is a turn-on voltage of the PMOS transistor P1, and $U_{TH}$ is a lower limit of an absolute value of the gate-source voltage between the gate and the source which turns on the PMOS transistor P1.

The turn-on condition of the P-channel MOSFET P1 is that the source voltage $U_S$ is higher than the gate voltage $U_G$ and the absolute value of the gate-source voltage $U_{GS}$ is higher than or equal to the turn-on voltage $U_{TH}$ of the P-channel MOSFET P1.

In order to disconnect the battery power supply circuit when the external power supply is connected, a resistance value r1 of the first resistor R1 and a resistance value r2 of the second resistor R2 satisfy the following conditions:

$$\frac{r_2}{r_1} \geq \frac{V_{SS2}}{U_{TH}} - 1.$$

In order to disconnect the battery power supply circuit when the external power supply is connected, the turn-on and turn-off of the PMOS transistor are analyzed in three cases as follows.

(Case 1) The battery connector module is connected to the battery, and the external power supply connector module is not connected to the external power supply.

When the external power supply connector module is not connected to the external power supply, the gate of the PMOS transistor P1 is connected to ground via the resistor R2 with the gate voltage $U_G$ being 0 v. When the battery connector module is connected to the battery, the drain of the PMOS transistor P1 is connected to a positive electrode of the battery, and the drain voltage is $U_D=V_{SS1}$. Because there is a parasitic diode effect between the drain and the source of the PMOS transistor P1 (the anode of the parasitic diode is connected to the drain, and the cathode of the parasitic diode is connected to the source), the source voltage of the PMOS transistor P1 is $U_S=U_D-V_{DT}=V_{SS1}-V_{DT}$, where $V_{DT}$ is a forward conduction voltage drop of the parasitic diode D1. Because an output voltage of a lithium battery is generally higher than 2.3 v, a maximum output voltage thereof is generally 4.35 v, and the forward conduction voltage drop $V_{DT}$ of the diode is generally less than 0.7 v, the source voltage $U_S$ is generally higher than 1.6 v. Accordingly, a PMOS transistor P1 with a turn-on voltage $U_{TH}$ less than or equal to 1 v may be selected, and at this time, the source voltage $U_S$ is higher than the gate voltage $U_G$ and the absolute value of the gate-source voltage $U_{GS}$ ($|U_{GS}| \geq 1.6$ v) is higher than the turn-on voltage $U_{TH}$ ($0 < U_{TH} \geq 1$ v) of the P-channel MOSFET P1. When the PMOS transistor P1 is turned on, current flows from the drain to the source of the PMOS transistor P1, and the battery power supply circuit is in a connected state, and thus power is supplied from the battery.

(Case 2) The battery connector module is not connected to the battery, and the external power supply connector module is connected to the external power supply.

When the external power supply connector module is connected to the external power supply, the source of the PMOS transistor P1 is connected to the positive electrode of the external power supply with the source voltage $U_S$ being the voltage $V_{SS2}$ of the external power supply, and the drain of the PMOS transistor P1 is suspended with the parasitic diode D1 between the drain and the source being turned off.

The gate voltage $U_G$ of the PMOS transistor P1 is:

$$U_G = \frac{r_2}{r_1 + r_2} \cdot V_{SS2} \qquad (1\text{-}1)$$

where, r1 is the resistance value of the first resistor R1, and r2 is the resistance value of the second resistor R2.

The gate-source voltage $U_{GS}$ is:

$$U_{GS} = U_G - U_S = \frac{-r_1}{r_1 + r_2} \cdot V_{SS2} \qquad (1\text{-}2)$$

It is required that the absolute value of the gate-source voltage $U_{GS}$ is lower than the turn-on voltage $U_{TH}$ of the PMOS transistor P1 so as to ensure that the PMOS transistor P1 is turned off at this time, that is, $$\left| \frac{-r_1}{r_1 + r_2} \cdot V_{SS2} \right| \leq U_{TH}, \qquad (1\text{-}3)$$

$$\text{i.e.,} \frac{r_2}{r_1} \geq \frac{V_{SS2}}{U_{TH}} - 1. \qquad (1\text{-}4)$$

When the resistance value r1 of the first resistor R1 and the resistance value r2 of the second resistor R2 satisfy the above expression (1-4), it can be ensured that the PMOS transistor P1 is turned off after the external power supply connector module is connected to the external power supply.

If r2:r1 is designed, for example, to be 100:1, when the voltage $V_{SS2}$ of the external power supply is equal to the maximum output voltage $V_{SS1-max}$ (4.35 v) of the battery, the absolute value $|U_{GS}|$ of the gate-source voltage $U_{GS}$ is about 0.043 v, which is far less than the turn-on voltage $U_{TH}$, and therefore the PMOS transistor P1 is turned off; the power supply circuit of the external power supply is in a connected state, and the battery power supply circuit is in a disconnected state, and thus power is supplied from the external power supply.

(Case 3) The battery connector module is connected to the battery, and the external power supply connector module is connected to the external power supply.

When the external power supply connector module is connected to the external power supply, the source of the PMOS transistor P1 is connected to the positive electrode of the external power supply with the source voltage $U_S$ being the voltage $V_{SS2}$ of the external power supply, and the drain of the PMOS transistor P1 is connected to the positive electrode of the battery with the drain voltage $U_D$ being the voltage $V_{SS1}$ of the battery power supply. When the voltage $V_{SS2}$ of the external power supply is equal to the maximum output voltage $V_{SS1\text{-}max}$ of the battery, the parasitic diode D1 between the drain and the source is turned off.

The gate voltage $U_G$ of the PMOS transistor P1 is:

$$U_G = \frac{r_2}{r_1 + r_2} \Box V_{SS2} \qquad (2\text{-}1)$$

where, r1 is the resistance value of the first resistor R1, and r2 is the resistance value of the second resistor R2.

The gate-source voltage $U_{GS}$ is:

$$U_{GS} = U_G - U_S = \frac{-r_1}{r_1 + r_2} \Box V_{SS2} \qquad (2\text{-}2)$$

It is required that the absolute value of the gate-source voltage $U_{GS}$ is lower than the turn-on voltage $U_{TH}$ of the PMOS transistor P1 so as to ensure that the PMOS transistor P1 is turned off at this time, that is, $$\left| \frac{-r_1}{r_1 + r_2} \Box V_{SS2} \right| \leq U_{TH}, \qquad (2\text{-}3)$$

$$\text{i.e., } \frac{r_2}{r_1} \geq \frac{V_{SS2}}{U_{TH}} - 1. \qquad (2\text{-}4)$$

When the resistance value r1 of the first resistor R1 and the resistance value r2 of the second resistor R2 satisfy the above expression (2-4), it can be ensured that the PMOS transistor P1 is turned off after the external power supply connector module is connected to the external power supply.

If r2:r1 is designed, for example, to be 100:1, when the voltage $V_{SS2}$ of the external power supply is equal to the maximum output voltage $V_{SS1\text{-}max}$ (4.35 v) of the battery, the absolute value $|U_{GS}|$ of the gate-source voltage $U_{GS}$ is about 0.043 v, which is far less than the turn-on voltage $U_{TH}$, and therefore the PMOS transistor P1 is turned off; the power supply circuit of the external power supply is in a connected state, and the battery power supply circuit is in a disconnected state, and thus power is supplied from the external power supply.

Figure 4:
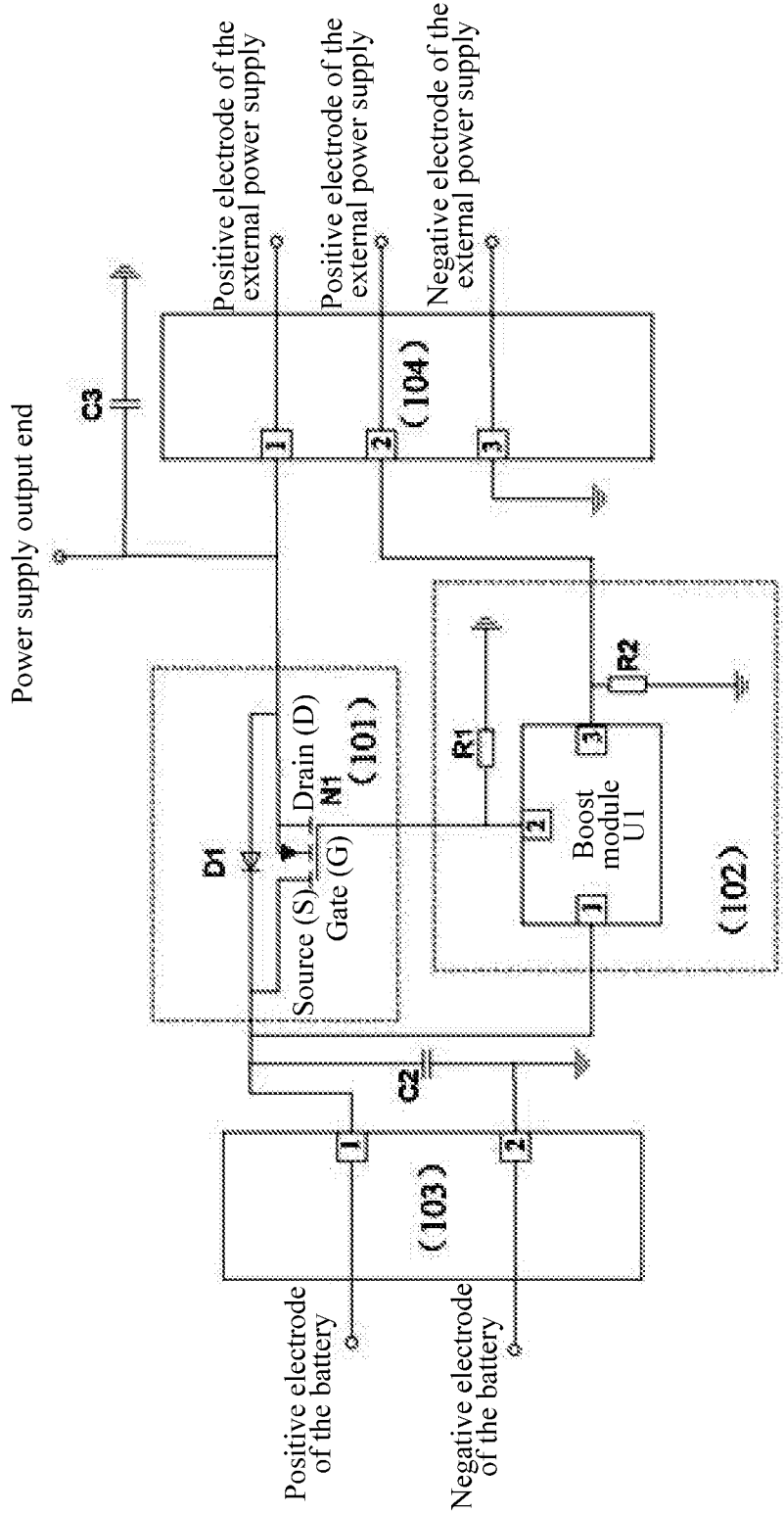
FIG. 4 is a schematic diagram of the control circuit compatible with a battery power supply and an external power supply according to Embodiment One of the present disclosure, in which the switch module includes an N-channel MOSFET.

As shown in FIG. 4, in one implementation mode, the switch module includes: an N-channel MOSFET (Metal Oxide Semiconductor Field Effect Transistor) N1.

A source of the N-channel MOSFET N1 serves as the first end of the switch module; a gate of the N-channel MOSFET N1 serves as the second end of the switch module; and a drain of the N-channel MOSFET N1 serves as the third end of the switch module.

The switch control module includes: a boost module U1. A first end of the boost module serves as the first end of the switch control module; a second end of the boost module servers as the second end of the switch control module; and a third end of the boost module serves as the third end of the switch control module.

The boost module is configured to prohibit the boost module from performing boosting processing when a voltage of the third end of the boost module is at a high level, and to enable the boost module to perform boosting processing when the voltage of the third end of the boost module is at a low level. The boosting processing is to perform a boosting processing on an input voltage of the first end of the boost module to obtain a boosting signal and to output the boosting signal from the second end of the boost module.

The second end of the boost module is connected to ground via a connection with the first resistor R1, and the third end of the boost module is connected to ground via a connection with the second resistor R2.

In the present embodiment, the N-channel MOSFET N1 is turned on when a turn-on condition is satisfied and turned off when the turn-on condition is not satisfied. When the N-channel MOSFET N1 is turned on, a circuit between the drain and the source is connected, and when the N-channel MOSFET N1 is turned off, the circuit between the drain and the source is disconnected.

In the present embodiment, a source voltage of the N-channel MOSFET (which may be simply referred to as NMOS transistor) N1 is $U_S$, a gate voltage thereof is $U_G$, and a drain voltage thereof is $U_D$. A voltage of the battery power supply is $V_{SS1}$, and A voltage of the external power supply is $V_{SS2}$. A gate-source voltage $U_{GS}$ between the gate and the source of the NMOS transistor N1 is $U_{GS}=U_G-U_S$. A turn-on voltage of the NMOS transistor N1 is $U_{TH}$.

The turn-on condition of the N-channel MOSFET N1 is that the gate voltage $U_G$ is higher than the source voltage $U_S$ and the absolute value of the gate-source voltage $U_{GS}$ is higher than or equal to the turn-on voltage $U_{TH}$ of the N-channel MOSFET N1.

When the boost module adopts a boost chip, a power supply end of the boost chip is connected with the battery connector module, that is, the boost chip has its power supply voltage taken from the battery. When the battery connector module is connected to the battery, the boost chip is in a working state, and when the battery connector module is not connected to the battery, the boost chip is in a non-working state due to a lack of power supply. In order to disconnect the battery power supply circuit when the external power supply is connected, the turn-on and turn-off of the NMOS transistor are analyzed in three cases as follows.

(Case 1) The battery connector module is connected to the battery, and the external power supply connector module is not connected to the external power supply.

When the battery connector module is connected to the battery, the source of the NMOS transistor N1 is connected to the positive electrode of the battery, and the source voltage is $U_S=V_{SS1}$. When the external power supply connector module is not connected to the external power supply, the third end of the boost module has a voltage at low level (0 v). The boost module performs boosting processing which is to perform boosting processing on an input voltage ($V_{SS1}$) of the first end of the boost module to obtain a boosting signal ($V_H$) and to output the boosting signal $V_H$ from the second end of the boost module. The gate of the NMOS transistor N1 is connected to the second end of the boost module, and the gate voltage $U_G$ is $V_H$. The gate-source voltage $U_{GS}$ between the gate and the source of the NMOS transistor N1 is $U_{GS}=U_G-U_S=V_H-V_{SS1}$.

When the absolute value $|U_{GS}|$ of the gate-source voltage $U_{GS}$ is higher than or equal to the turn-on voltage $U_{TH}$ of the N-channel MOSFET N1, the NMOS transistor N1 is turned on. $U_{TH}$ is a lower limit of an absolute value of the gate-source voltage between the gate and the source which turns on the N-channel MOSFET N1.

In other words, the NMOS transistor N1 is turned on when the boosting processing of the boost module satisfies the following conditions.

$$|V_H-V_{SS1}|\geq U_{TH} \quad (3\text{-}1)$$

Generally, an output voltage of a lithium battery is between 2.3 v and 4.35 v, and a turn-on voltage $U_{TH}$ of an N-channel MOSFET N1 does not exceed 1 v. As a result, if the boosting processing is to linearly amplify the input voltage, then a suitable amplification factor (for example, greater than or equal to 1.5 times) can be selected to satisfy the condition that a difference between the output voltage and the input voltage of the boosting module is higher than or equal to the turn-on voltage of the NMOS transistor.

When the NMOS transistor N1 is turned on, current flows from the drain to the source of the NMOS transistor N1, and the battery power supply circuit is in a connected state, and thus power is supplied from the battery.

(Case 2) The battery connector module is not connected to the battery, and the external power supply connector module is connected to the external power supply.

When the battery connector module is not connected to the battery, the boost chip is in a non-working state due to a lack of power supply. The second end of the boost module is connected to ground via the resistor R1, and the gate of the NMOS transistor N1 is connected to the second end of the boost module with the voltage being 0 v. The source of the NMOS transistor N1 is connected to the first end of the battery connector module (the first end is suspended when the battery connector module is not connected to the battery). Accordingly, when the gate-source voltage $U_{GS}$ between the gate and the source of the NMOS transistor N1 is less than the turn-on voltage $U_{TH}$, the NMOS transistor N1 is turned off; the power supply circuit of the external power supply is in a connected state, and the battery power supply circuit is in a disconnected state, and thus power is supplied from the external power supply.

(Case 3) The battery connector module is connected to the battery, and the external power supply connector module is connected to the external power supply.

When the battery connector module is connected to the battery, the source of the NMOS transistor N1 is connected to the positive electrode of the battery, and the source voltage $U_S$ is $V_{SS1}$.

When the external power supply connector module is connected to the external power supply, a voltage of the third end of the boost module is at a high level (external power supply voltage $V_{SS2}$), which prohibits the boost module from performing boosting processing; there is no boosting signal output from the second end of the boost module; and the second end of the boost module is connected to ground via the resistor R1. The gate of the NMOS transistor N1 is connected to the second end of the boost module, and the gate voltage is 0 v.

Because the source voltage $U_S$ ($V_{SS1}$) of the NMOS transistor N1 is higher than the gate voltage $U_G$ (0 v), the turn-on condition of the NMOS transistor N1 is not satisfied and the NMOS transistor N1 is turned off. The power supply circuit of the external power supply is in a connected state, and the battery power supply circuit is in a disconnected state, and thus power is supplied from the external power supply.

It should be noted that there are other various embodiments of the present disclosure. Various changes and modifications can be made in accordance with the present disclosure by persons skilled in the art without departing from the spirit and scope of the disclosure, and all these changes and modifications are intended to fall within the scope of the appended claims.

INDUSTRIAL APPLICABILITY

The technical solutions provided by the embodiments of the present disclosure may be applied to the field of terminal technologies. With the technical solutions provided by the embodiment of the present invention, a switch module and a switch control module are added between the battery power supply and the external power supply. The switch control module outputs different control signals to the switch module by detecting whether the external power supply is connected, and the switch module disconnects the battery power supply circuit when receiving the control signal corresponding to the detection of the external power supply and enables the external power supply. Embodiments of the present disclosure are capable of supply power to an electronic device from an external power supply without taking out the battery, thereby prolonging the life span of the battery.

What is claimed is:

1. A control circuit compatible with a battery power supply and an external power supply, comprising:
    a switch module, a switch control module, a battery connector module, and an external power supply connector module, a first end of the switch module being connected to the battery connector module, a second end of the switch module being connected to a second end of the switch control module, and a third end of the switch module, which serves as a power supply output end, being connected to the external power supply connector module, wherein
    the switch module is configured to disconnect a power supply circuit between the battery connector module and the power supply output end when receiving a first control signal output from the switch control module, and to connect the power supply circuit between the battery connector module and the power supply output end when receiving a second control signal output from the switch control module;
    the switch control module is configured to output the first control signal when receiving an external power supply signal output from the external power supply connector module, and to output the second control signal when failing to receive an external power supply signal output from the external power supply connector module;
    the battery connector module is configured to output a battery power supply signal to the switch module when being connected to a battery; and
    the external power supply connector module is configured to output the external power supply signal to the switch module and the switch control module when being connected to the external power supply,
    the switch module comprises: a P-channel metal oxide semiconductor field effect transistor P1, wherein a drain of the P-channel metal oxide semiconductor field effect transistor P1 serves as the first end of the switch module; a gate of the P-channel metal oxide semiconductor field effect transistor P1 serves as the second end of the switch module; and a source of the P-channel metal oxide semiconductor field effect transistor P1 serves as the third end of the switch module;

the switch control module comprises: a first resistor R1, a second resistor R2 and a first capacitor C1, wherein, a first end of the first resistor R1 serves as a first end of the switch control module; a second end of the first resistor R1 serves as the second end of the switch control module and is connected to a first end of the second resistor R2 and a first end of the first capacitor C1; and a second end of the second resistor R2 and a second end of the first capacitor C1 are connected to ground, wherein a resistance value r1 of the first resistor R1 and a resistance value r2 of the second resistor R2 satisfy the following conditions:

$$\frac{r_2}{r_1} \geq \frac{V_{SS2}}{U_{TH}} - 1$$

wherein, $V_{ss2}$ is a voltage of the external power supply, and $U_{TH}$ is a lower limit of an absolute value of a gate-source voltage between the gate and the source which turns on the P-channel metal oxide semiconductor field effect transistor P1.

2. The control circuit according to claim 1, wherein the battery connector module comprises two ends, and the external power supply connector module comprises three ends, wherein a first end of the battery connector module is a battery positive electrode connecting end and is connected to the first end of the switch module, and a second end of the battery connector module is a battery negative electrode connecting end and is connected to ground;

a first end of the external power supply connector module is an external power supply positive electrode connecting end and is connected to the third end of the switch module; a second end of the external power supply connector module is an external power supply positive electrode connecting end and is connected to a first end of the switch control module; and a third end of the external power supply connector module is an external power supply negative electrode connecting end and is connected to ground.

3. A control circuit compatible with a battery power supply and an external power supply, comprising:

a switch module, a switch control module, a battery connector module, and an external power supply connector module, a first end of the switch module being connected to the battery connector module, a second end of the switch module being connected to a second end of the switch control module, and a third end of the switch module, which serves as a power supply output end, being connected to the external power supply connector module, wherein the switch module is configured to disconnect a power supply circuit between the battery connector module and the power supply output end when receiving a first control signal output from the switch control module, and to connect the power supply circuit between the battery connector module and the power supply output end when receiving a second control signal output from the switch control module;

the switch control module is configured to output the first control signal when receiving an external power supply signal output from the external power supply connector module, and to output the second control signal when failing to receive an external power supply signal output from the external power supply connector module;

the battery connector module is configured to output a battery power supply signal to the switch module when being connected to a battery; and the external power supply connector module is configured to output the external power supply signal to the switch module and the switch control module when being connected to the external power supply, the switch module comprises: an N-channel metal oxide semiconductor field effect transistor N1, wherein a source of the N-channel metal oxide semiconductor field effect transistor N1 serves as the first end of the switch module; a gate of the N-channel metal oxide semiconductor field effect transistor N1 serves as the second end of the switch module; and a drain of the N-channel metal oxide semiconductor field effect transistor N1 serves as the third end of the switch module;

the switch control module comprises: a boost module U1, wherein a first end of the boost module serves as a first end of the switch control module; a second end of the boost module servers as the second end of the switch control module; and a third end of the boost module serves as a third end of the switch control module;

the boost module is configured to prohibit the boost module from performing boosting processing when a voltage of the third end of the boost module is at a high level, and to enable the boost module to perform boosting processing when the voltage of the third end of the boost module is at a low level, wherein the boosting processing is to perform boosting processing on an input voltage of the first end of the boost module to obtain a boosting signal and to output the boosting signal from the second end of the boost module;

the second end of the boost module is connected to ground via a connection with a first resistor R1, and the third end of the boost module is connected to ground via a connection with a second resistor R2, wherein, the boosting processing of the boost module satisfies the following conditions:

$$|V_H - V_{SS1}| \geq U_{TH},$$

wherein, $V_H$ is a voltage of the boosting signal; $V_{SS1}$ is a voltage of the battery power supply; and $U_{TH}$ is a lower limit of an absolute value of a gate-source voltage between the gate and the source which turns on the N-channel metal oxide semiconductor field effect transistor N1.

4. The control circuit according to claim 3, wherein the boost module comprises a boost chip, a power supply end of the boost chip being connected to the battery connector module.

5. The control circuit according to claim 3, wherein the battery connector module comprises two ends, and the external power supply connector module comprises three ends, wherein a first end of the battery connector module is a battery positive electrode connecting end and is connected to the first end of the switch module, and a second end of the battery connector module is a battery negative electrode connecting end and is connected to ground;

a first end of the external power supply connector module is an external power supply positive electrode connecting end and is connected to the third end of the switch module; a second end of the external power supply connector module is an external power supply positive electrode connecting end and is connected to a first end of the switch control module; and a third end of the external power supply connector module is an external power supply negative electrode connecting end and is connected to ground.

\* \* \* \* \*